US010939586B2

(12) United States Patent
Van Der Veer et al.

(10) Patent No.: US 10,939,586 B2
(45) Date of Patent: Mar. 2, 2021

(54) HEAT EXCHANGER STRUCTURE FOR A RACK ASSEMBLY

(71) Applicant: ABB Schweiz AG, Baden (CH)

(72) Inventors: Clemens Christiaan Van Der Veer, Florence (IT); Fabio Tombelli, Terranuova Bracciolini (IT); Filippo Chimento, Catania (IT); Mauro Piazzesi, Terranuova Bracciolin (IT); Daniel Gerber, Florence (IT)

(73) Assignee: ABB Schweiz AG, Baden (CH)

( * ) Notice: Subject to any disclaimer, the term of this patent is extended or adjusted under 35 U.S.C. 154(b) by 189 days.

(21) Appl. No.: 16/007,179

(22) Filed: Jun. 13, 2018

(65) Prior Publication Data

US 2018/0359880 A1 Dec. 13, 2018

(30) Foreign Application Priority Data

Jun. 13, 2017 (EP) ..................... 17175789

(51) Int. Cl.
*H05K 7/20* (2006.01)
*F28F 3/02* (2006.01)
*H02J 7/00* (2006.01)

(52) U.S. Cl.
CPC ......... *H05K 7/20545* (2013.01); *F28F 3/025* (2013.01); *H05K 7/209* (2013.01); *H05K 7/20909* (2013.01); *H02J 7/0042* (2013.01)

(58) Field of Classification Search
CPC ............... H05K 7/20545; H05K 7/209; H05K 7/20909; F28F 3/025; H02J 7/0042
USPC ....................................................... 361/710
See application file for complete search history.

(56) References Cited

U.S. PATENT DOCUMENTS

| 5,065,278 A | * | 11/1991 | Schultz | H05K 7/209 361/688 |
| 5,930,113 A | * | 7/1999 | McCann | H05K 7/20409 361/688 |
| 5,946,192 A | * | 8/1999 | Ishigami | H05K 7/20418 257/719 |

(Continued)

FOREIGN PATENT DOCUMENTS

| EP | 1283589 A2 | 2/2003 |
| EP | 1283589 A3 | 3/2003 |

(Continued)

OTHER PUBLICATIONS

European Patent Office, Extended Search Report issued in corresponding Application No. 17175789.1, dated Sep. 8, 2017, 8 pp.

*Primary Examiner* — Anatoly Vortman
(74) *Attorney, Agent, or Firm* — Taft Stettinius & Hollister LLP (57) ABSTRACT

Heat exchanger structure for a rack assembly formed by a shaped body of thermally conductive material. The heat exchanger structure comprises a first heat exchanging portion adapted to provide a mechanical support for one or more power electronic components of said rack assembly and adapted to absorb and dissipate heat generated by said power electronic components. The heat exchanger structure comprises a second heat exchanging portion adapted to provide a mechanical support for one or more power electromagnetic components of said rack assembly and adapted to absorb and dissipate heat generated by said power electromagnetic components.

20 Claims, 8 Drawing Sheets

(56) References Cited

U.S. PATENT DOCUMENTS

| | | | | |
|---|---|---|---|---|
| 5,973,923 | A * | 10/1999 | Jitaru | H01F 27/06 165/185 |
| 6,222,733 | B1 * | 4/2001 | Gammenthaler | H01F 27/22 165/80.3 |
| 6,349,033 | B1 * | 2/2002 | Dubin | H01L 23/36 165/185 |
| 6,459,586 | B1 * | 10/2002 | Miller | H01F 17/043 174/252 |
| 6,473,304 | B1 * | 10/2002 | Stevens | H02M 3/00 174/528 |
| 6,724,631 | B2 * | 4/2004 | Ye | H01L 23/36 257/707 |
| 6,995,978 | B2 * | 2/2006 | Strauss | H02B 1/565 165/185 |
| 7,031,156 | B2 * | 4/2006 | Naiva | H05K 7/20909 361/695 |
| 7,375,974 | B2 * | 5/2008 | Kirigaya | H05K 1/0203 361/752 |
| 7,474,185 | B2 * | 1/2009 | Hooey | H01F 27/266 336/55 |
| 8,031,470 | B2 * | 10/2011 | Nelson | H05K 7/20518 165/185 |
| 8,492,683 | B2 * | 7/2013 | Challita | H05B 6/105 219/618 |
| 8,520,381 | B2 | 8/2013 | Hobein et al. | |
| 8,848,375 | B2 * | 9/2014 | Rai | H05K 7/142 165/80.2 |
| 8,929,078 | B2 * | 1/2015 | Weeber | H01L 23/552 165/80.3 |
| D756,921 | S * | 5/2016 | Benn | D13/110 |
| 9,362,040 | B2 * | 6/2016 | Rai | H05K 7/20927 |
| 9,615,490 | B2 * | 4/2017 | Topolewski | H05K 7/20254 |
| 9,681,565 | B2 * | 6/2017 | Escamilla | H05K 5/065 |
| 9,980,365 | B1 * | 5/2018 | Chen | H05K 1/09 |
| 2002/0141159 | A1 * | 10/2002 | Bloemen | H04M 19/00 361/704 |
| 2002/0196646 | A1 * | 12/2002 | Cook | H02M 7/003 363/141 |
| 2005/0242913 | A1 | 11/2005 | Hooey et al. | |
| 2010/0302728 | A1 * | 12/2010 | Knaup | H05K 7/20918 361/690 |
| 2012/0020021 | A1 * | 1/2012 | Kishimoto | H02M 5/271 361/695 |
| 2012/0234520 | A1 | 9/2012 | Pal et al. | |
| 2016/0295740 | A1 * | 10/2016 | Shibata | H05K 7/20472 |

FOREIGN PATENT DOCUMENTS

| | | |
|---|---|---|
| EP | 2166826 A2 | 3/2010 |
| EP | 2166826 A3 | 4/2010 |

* cited by examiner

HEAT EXCHANGER STRUCTURE FOR A RACK ASSEMBLY

BACKGROUND

The present invention relates to a heat exchanger structure for a rack assembly suitable for low voltage installations.

For the sake of clarity, it is specified that the term "low voltage" refers to operating voltages lower than 1 kV AC and 1.5 kV DC.

Rack assemblies are widely adopted in LV applications.

As an example, a battery charger installation commonly includes a rack assembly including a plurality of stacked battery charger modules, each of which normally comprises a power converter.

As is known, modern rack assemblies for LV applications are normally required to provide high levels of power density, for example in the range of 50-500 W/m$^3$.

This fact entails the need for developing efficient cooling solutions to ensure a proper operation of the components of the rack assembly and the compliance with international standards.

In general, traditional heat exchangers for use in a rack assembly are designed to provide heat absorption and dissipation for power electronic components (e.g. power electronic devices and power electronic circuits, etc.) of the rack assembly but are not conceived for thermally interacting with power electromagnetic components (e.g. power transformers, power inductors, etc.) of the rack assembly.

As a consequence, it is necessary to adopt suitable ventilation arrangements to ensure a proper cooling of these components of the rack assembly.

However, in some applications, for example in battery charger installations, such ventilation arrangements are quite complex and expensive to implement at industrial level.

SUMMARY

The main aim of the present invention is to provide a heat exchanger structure for a rack assembly, which enables the disadvantages described above to be overcome.

Within this aim, another object of the present invention is to provide a heat exchanger structure providing efficient cooling performances for both power electronic components and power electromagnetic components of a rack assembly.

Another object of the present invention is to provide a heat exchanger structure, which allows simplifying the overall thermal management of a rack assembly.

Another object of the present invention is to provide a heat exchanger structure, which allows simplifying the implementation of ventilation arrangements in a rack assembly.

Another object of the present invention is to provide a heat exchanger structure, which simplifies the installation of electronic and electromagnetic components in a rack assembly.

Another object of the present invention is to provide a heat exchanger structure, which is easy and inexpensive to produce at industrial level.

The above aim and objects, together with other objects that will be more apparent from the subsequent description and from the accompanying drawings, are achieved, according to the invention, by a heat exchanger structure, according to one or more of the claims.

In a general definition, the heat exchanger structure, according to the invention, comprises a shaped body of thermally conductive material, Preferably, the shaped body has an elongated shape and extends along a main longitudinal axis.

Preferably, said shaped body is formed by a single piece of thermally conductive material, which, for example, may be obtained through an extrusion process.

The heat exchanger structure, according to the invention, comprises a first heat exchanging portion adapted to provide a mechanical support for one or more power electronic components of the rack assembly and adapted to absorb and dissipate heat generated by said power electronic components.

The heat exchanger structure, according to the invention, comprises a second heat exchanging portion adapted to provide a mechanical support for one or more power electromagnetic components of the rack assembly and adapted to absorb and dissipate heat generated by said power electromagnetic components.

According to the invention, said second heat exchanging portion forms a recess for accommodating said power electromagnetic components and at least partially segregating said power electromagnetic components with respect to said electronic components and the surrounding environment.

The heat exchanger structure, according to the invention, provides relevant advantages.

Differently from known solutions of the state of the art, the heat exchanger structure, according to the invention, is capable of providing a single heat sink for both power electronic and electromagnetic components of a rack assembly.

As it will be evidenced in the following, the first and second heat exchanging portions of the heat exchanger structure, according to the invention, are conveniently designed to improve the passage of a cooling fluid (e.g. ventilation air) on both power electronic and electromagnetic components operatively associated therewith, thereby further facilitating their cooling.

The heat exchanger structure, according to the invention, provides a mechanical support structure for both power electronic and electromagnetic components of a rack assembly, thereby facilitating their operative arrangement.

As said power electromagnetic components are accommodated in the recess formed by the second heat exchanging portion, the heat exchanger structure, according to the invention, allows achieving an improved structural integration between the power electronic and electromagnetic components operatively associated therewith while maintaining an optimal physical segregation between these latter, as required by international standards.

At the same time, the heat exchanger structure, according to the invention, allows obtaining an improved protection from dust and water for the power electromagnetic components.

In a further aspect, the present invention relates to a rack module, for low or medium voltage applications, that includes a heat exchanger.

The rack module, according to this aspect of the invention, comprises power electronic components operatively associated with the first heat exchanging portion of the heat exchanger structure and power electromagnetic components operatively associated with the second heat exchanging portion of the heat exchanger structure.

In a further aspect, the present invention relates to a rack assembly, for low or medium voltage applications, that includes one or more heat exchangers.

In yet a further aspect, the present invention relates to a battery charger installation for a rack assembly comprising one or more heat exchangers.

BRIEF DESCRIPTION OF THE DRAWINGS

Further characteristics and advantages of the present invention will be more apparent with reference to the description given below and to the accompanying figures, provided purely for explanatory and non-limiting purposes, wherein.

DETAILED DESCRIPTION

With reference to the aforesaid figures, the present invention relates to a thermal exchanger structure 1 for a rack assembly 100.

The rack assembly 100 is intended for use in low or medium voltage applications.

In principle, the rack assembly 100 may be of any type, according to the needs.

As an example, it may be a rack assembly used in an electric power distribution grid.

The rack assembly 100 is however particularly suitable for use in battery charger installations and will be hereinafter described with particular reference to these applications without intending to limit the scope of the invention.

The rack assembly 100 comprises one or more power electronic components 200, for example power electronic devices (e.g. MOSFETs, IGBTs, power diodes, etc.), power electronic circuits (e.g. diode bridges, switching stages, etc.), and the like.

For the sake of clarity, the term "power electronic components" identifies electronic components normally operating at power levels higher than some hundreds of kW up to some tens of kW.

The rack assembly 100 further comprises one or more power electromagnetic components 300, for example power transformers, power inductors, and the like.

For the sake of clarity, the term "power electromagnetic components" identifies electromagnetic components normally operating at power levels higher than some hundreds of kW up to some tens of kW.

The rack assembly 100 further comprises additional electronic components 400 operating at lower power levels, for example active and passive circuit devices, control circuits, data processing devices (e.g. microprocessors), and the like.

Figure 6:
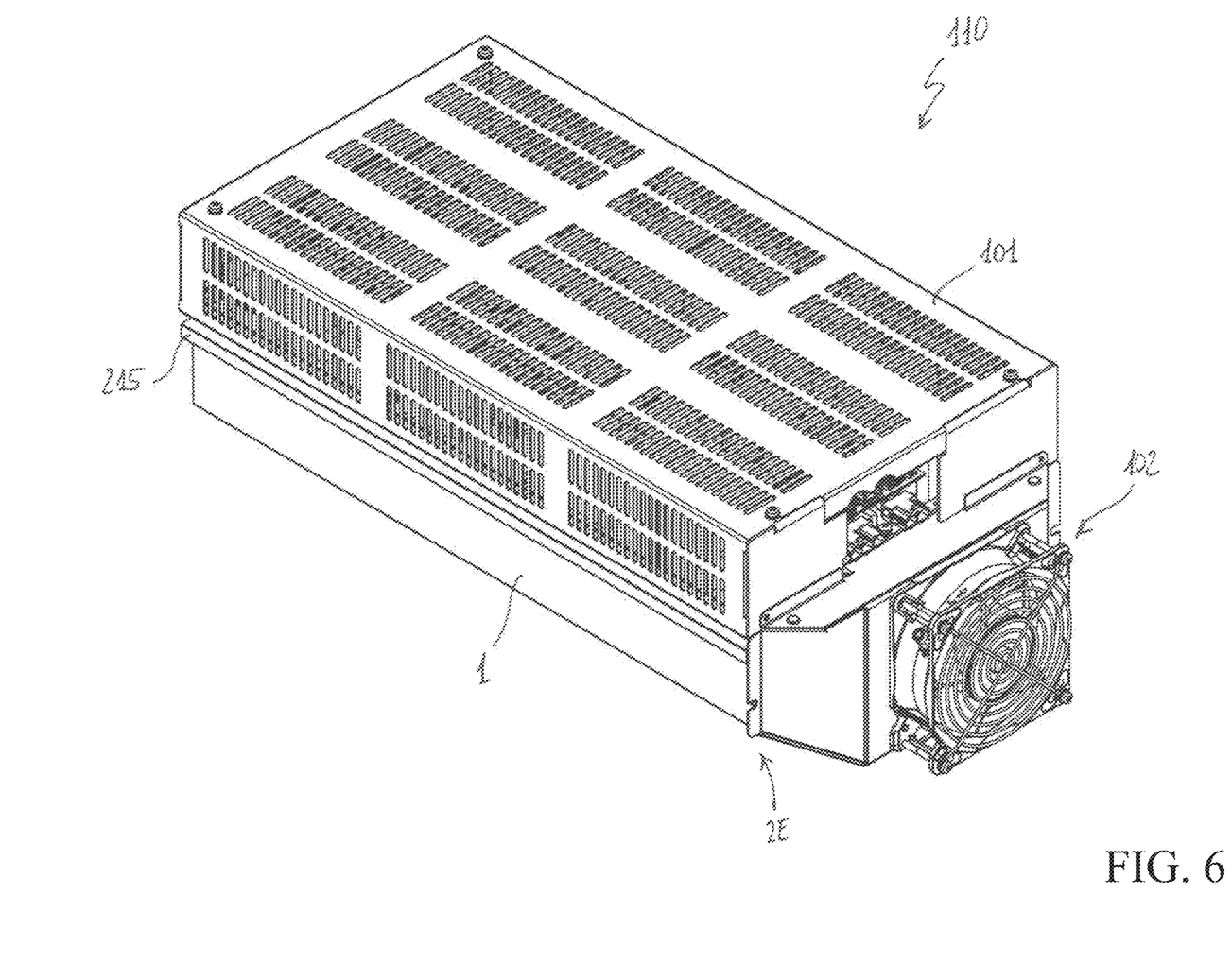
FIGS. 6-7 schematically illustrate a perspective view and a longitudinal section of a rack assembly including the heat exchanger structure, according to the present invention, when ready for installation in a rack assembly.

Conveniently, the power electronic components 200, the power electromagnetic components 300, the additional electronic components 400 of the rack assembly 100 are grouped in one or more rack modules (FIG. 6).

According to the invention, the heat exchanger structure 1 is formed by a shaped body of thermally conductive material, e.g. an Al alloy.

Preferably, the heat exchanger structure 1 is formed by a single piece of thermally conductive material.

Preferably, the heat exchanger structure 1 has an elongated shape and extends along a main longitudinal axis 20. As an example, the heat exchanger structure 1 may have substantially a tray-like shape, as shown in the cited figures.

In general, the heat exchanger structure 1 has opposite first and second main sides 2A, 2B, opposite third and fourth lateral sides 2C, 2D and opposite first and second ends 2E, 2F.

As it will better emerge from the following, most of the heat absorption and dissipation by the heat exchanger structure 1 occurs at its more extended sides, i.e. the first and second main sides 2A, 2B.

According to the invention, the heat exchanger structure 1 comprises a first heat exchanging portion 21, which is adapted to provide a mechanical support for one or more power electronic components 200 of the rack assembly 100 (when these latter are operatively associated therewith) and is adapted to absorb and dissipate heat generated by said power electronic components.

Preferably, the first heat exchanging portion 21 comprises at least a first heat exchanging wall 211 having opposite first and second surfaces 211A, 211B at the opposite first and second main sides 2A, 2B of the heat exchanger structure.

Preferably, at the first surface 211A, said at least a first heat exchanging wall 211 provides a mechanical support for power electronic components 200 intended to be operatively associated therewith and is in thermal contact with said power electronic components to absorb heat generated by said these latter.

Preferably, said at least a first heat exchanging wall 211 comprises fins 213 protruding from said second surface 211B.

Figure 1:
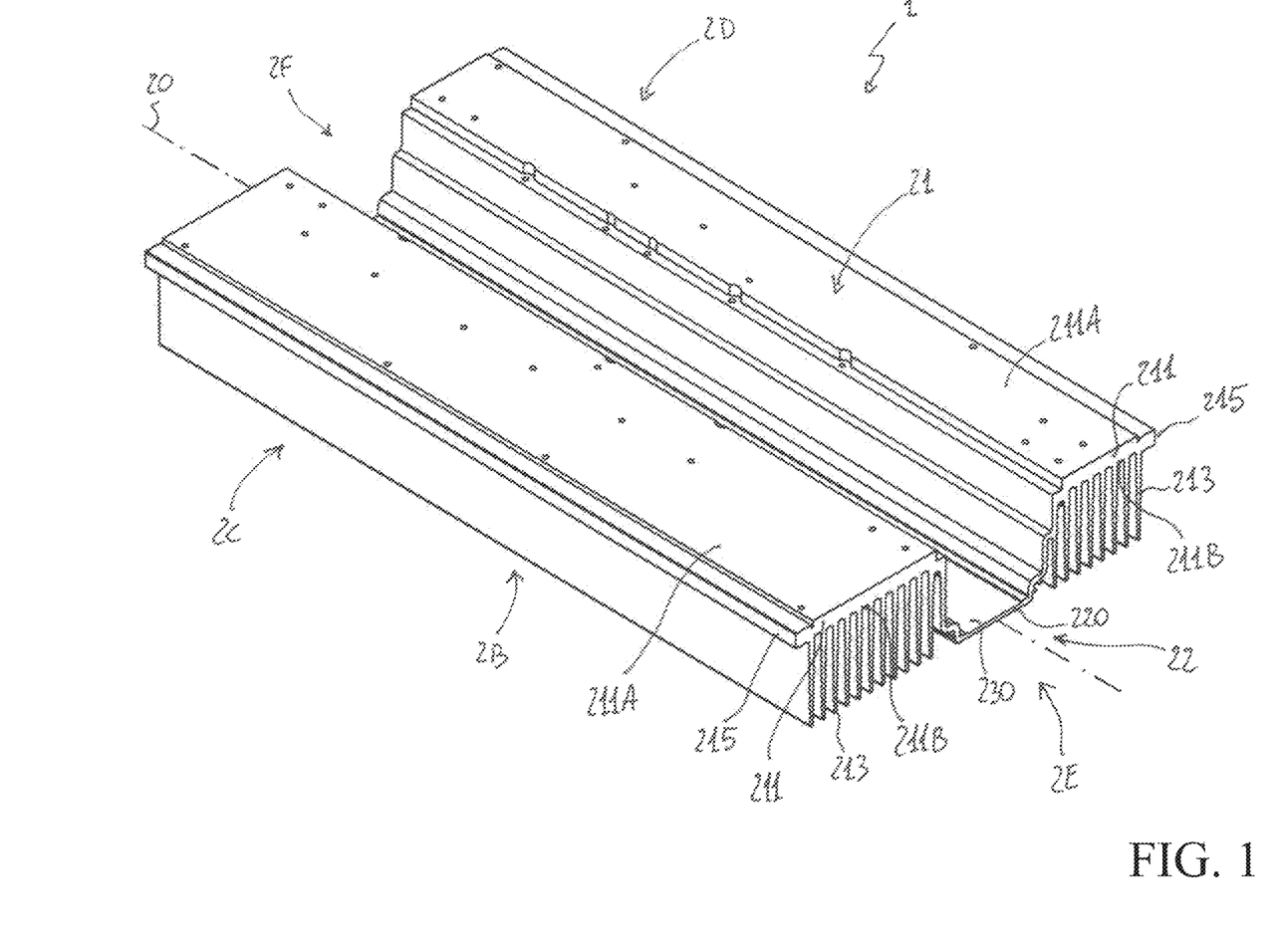
FIGS. 1-2 schematically illustrate embodiments of the heat exchanger structure, according to the present invention.
Figure 2:
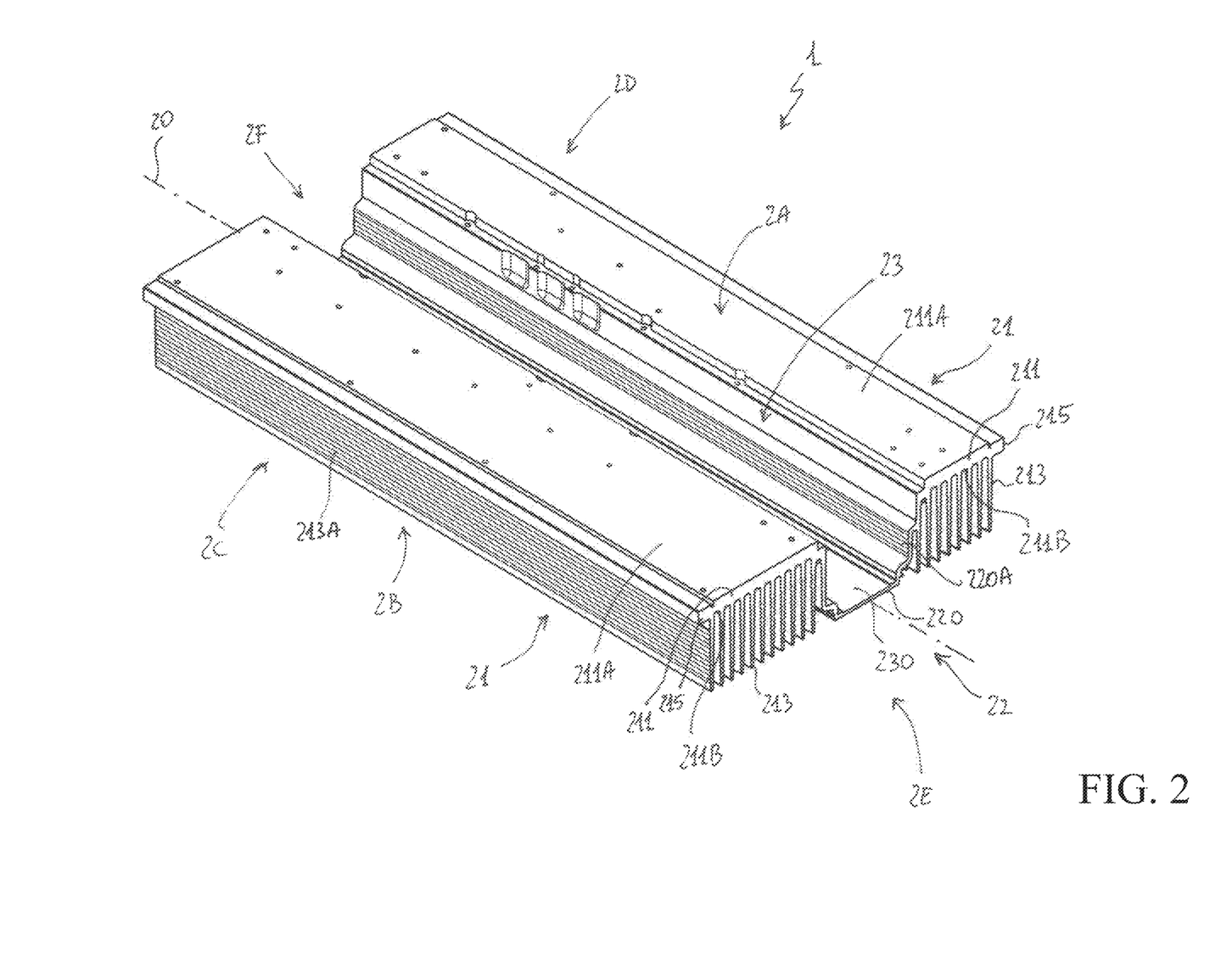

Preferably, said fins 213 have one or more corrugated surfaces 213A (FIG. 2).

In the embodiments shown in the cited figures, the first heat exchanging portion 21 is formed by a pair of first heat exchanging walls 211 extending along longitudinal directions parallel to the main longitudinal axis 20.

The first heat exchanging walls 211 are mutually spaced and coplanar, so as to define a common support plane for power electronic components 200 intended to be operatively associated therewith.

Each of the first heat exchanging walls 211 has first and second surfaces 211A, 211B at the opposite main sides 2A, 2B of the heat exchanger structure.

At the first surface 211A, the first heat exchanging walls 211 provide a mechanical support for power electronic components 200 intended to be operatively associated therewith and are in thermal contact with said power electronic components to absorb heat generated by these latter.

The first heat exchanging walls 211 comprise a plurality of fins 213 protruding from the second surface 211B.

Preferably, the fins 213 are perpendicular to the second surface 211B, parallel one to another and extend along longitudinal directions parallel to the main longitudinal axis 20. In this way, they form a plurality of ventilation channels for the passage of a cooling fluid (e.g. ventilated air), which extend between the ends 2E, 2F of the heat exchanger structure.

Preferably, the fins 213 have corrugated surfaces 213A to increase their overall heat exchanging area with the surrounding environment.

According to the invention, the heat exchanger structure 1 comprises a second heat exchanging portion 22, which is adapted to provide a mechanical support for one or more power electromagnetic components 300 of the rack assembly 100 (intended to operatively associated therewith) and which is adapted to absorb and dissipate heat generated by said power electromagnetic components.

According to the invention, the second heat exchanging portion 22 forms a recess 23 for accommodating said power electromagnetic components 300 and at least partially segregating these latter with respect to the surrounding environment.

Preferably, the second heat exchanging portion 22 comprises at least a second heat exchanging wall 220 that defines the recess 23 in such a way this latter has a blind bottom 230 and is open towards the first main side 2A of heat exchanger structure (in practice towards the side of the heat exchanger structure on which the power electronic components 200 are intended to be operatively associated with the shaped body 2).

Such a solution greatly facilitates the accommodation of the electromagnetic components 300 within the recess 23 and the cabling of these latter.

In the embodiments shown in the cited figures, the second heat exchanging portion 22 comprise one or more second heat exchanging walls 220 forming the recess 23 in such a way that this latter is positioned between the adjacent and spaced first heat exchanging walls 211 of the first heat exchanging portion 21.

The recess 23 has a blind bottom 230, is open towards the first main side 2A of the shaped body 2 and extends along a longitudinal direction parallel to the main longitudinal axis 20.

In practice, as it is evident from the cited figures, the second heat exchanging walls 220 form an elongated box-like housing defining the recess 23. Such an elongated housing is positioned between the adjacent and spaced first heat exchanging walls 211 and protrudes substantially perpendicularly from these latter to form the recess 23 at the first main side 2A of the heat exchanger structure.

The recess 23 thus forms an elongated channel extending along a longitudinal direction parallel to the main longitudinal axis A, which has a blind bottom 230 and is open towards the first main side 2A of the heat exchanger structure. Conveniently, the channel 23 is open also at the ends 2E, 2F of the heat exchanger structure to facilitate the passage of a cooling fluid (e.g. ventilation air).

Preferably, one or more second heat exchanging walls 220 have one or more corrugated surfaces 220A to increase their overall heat exchanging area with the surrounding environment (FIG. 2).

Preferably, the recess 23 is at least partially filled with a thermal resin 235, in which the power electromagnetic components 300 are at least partially buried.

The arrangement of the thermal resin 235 provides an improved distribution of the heat generated by the electromagnetic components 300 accommodated in the recess 23, thereby facilitating the heat absorption and dissipations by the second heat exchanging walls 220 of the second heat exchanging portion 22 of the heat exchange structure.

Preferably, one or more channels 236 are formed in the thermal resin 235 to allow the passage of a cooling fluid (e.g. ventilation air). The channels 236 are conveniently arranged along longitudinal directions parallel to the main longitudinal axis 20 between the ends 2E, 2F of the heat exchanger structure.

It is evident how this solution further facilitates the cooling the electromagnetic components 300 accommodated in the recess 23.

According to further embodiment of the invention (not shown), one or more second heat exchanging walls 220 of the second heat exchanging portion 22 may be provided with suitable fins to improve the thermal exchange with the surrounding environment.

As an example, the second heat exchanging wall 220 forming the bottom 230 of the recess 23 may be provided with fins arranged similarly to the fins 213 of the first heat exchanging portion 21.

Preferably, the heat exchanger structure 1 comprises one or more coupling portions 215 adapted to mechanically couple with suitable coupling surfaces (not shown) of the rack assembly 100 (more particularly of the supporting frame 103 thereof) for installing said heat exchanger structure in its operating portion.

Preferably, the coupling portions 215 are formed by one or more coupling edges protruding from the first exchanging walls 211 of the first heat exchanging portion 21 at the lateral sides 2C, 2D of the heat exchanging structure.

Preferably, the coupling portions 215 extend along the length of the first exchanging walls 211 at the lateral sides 2C, 2D of the heat exchanging structure, in parallel with the main longitudinal axis 20.

Figure 3:
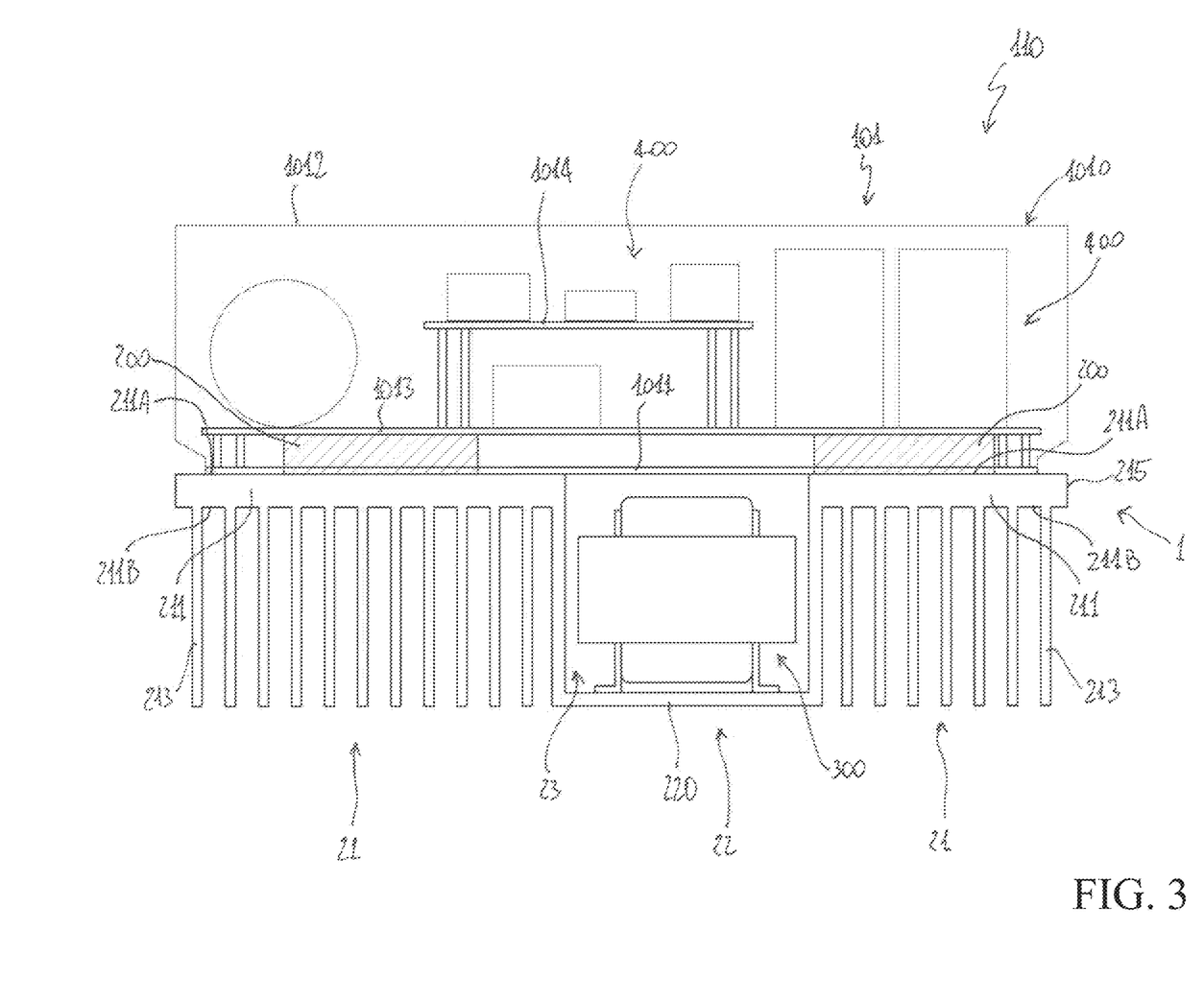
FIGS. 3-5 schematically illustrate views of a rack module including the heat exchanger structure, according to the present invention.
Figure 4:
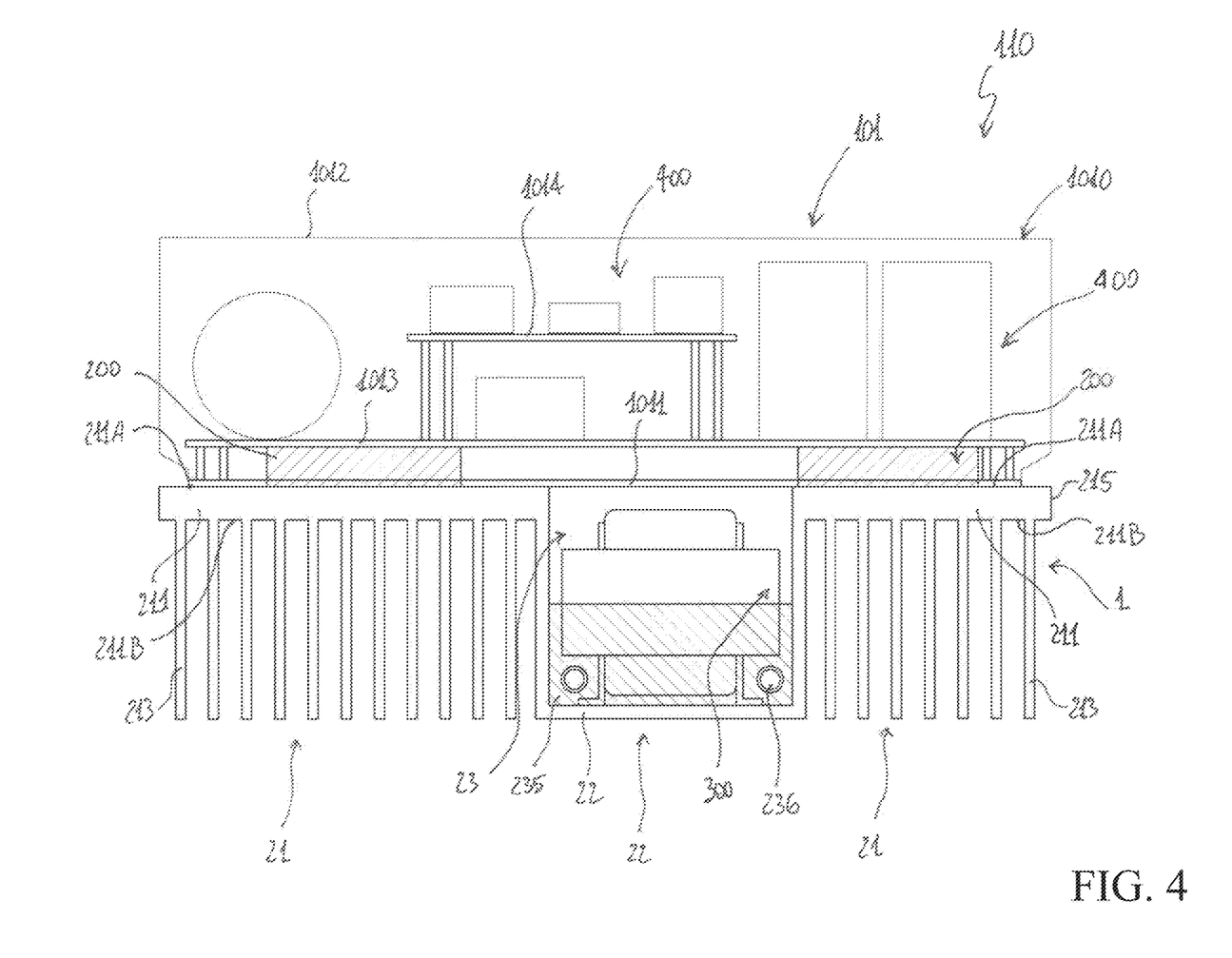
Figure 5:
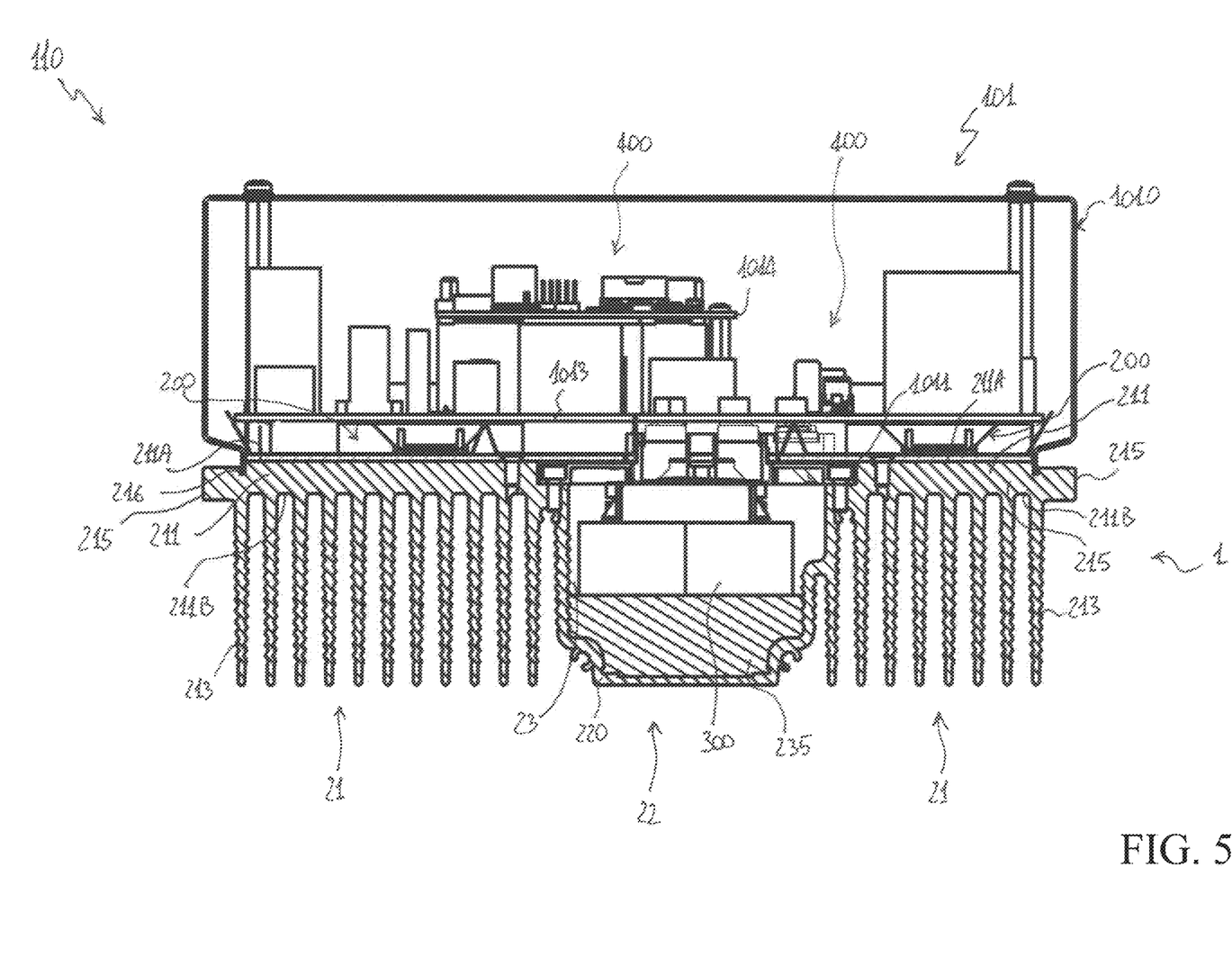

In FIGS. 3-5, cross sections views of a rack module 110 of the rack assembly 100 is shown.

The rack module 110 comprises an electronic module 101 including power electronic components 200.

The electronic module 101 is operatively associated to a heat exchanger structure 1, according to the invention, at the first side 2A of this latter.

Conveniently, the first heat exchanging portion 21 of the heat exchanger structure 1 provides a mechanical support to the electronic module 101 and, in operation, absorbs and dissipates heat generated by the power electronic components 200 included in the electronic module 101.

Preferably, the electronic module 101 comprises a housing 1010 that includes a base wall 1011, fixed to the first heat exchanging walls 211, and an outer case 1012, fixed to the first heat exchanging walls 211 at suitable coupling seats 216 of these latter.

Known fixing means (e.g. screws) may be used to fix the base wall 1011 and the outer case 1012 to the first heat exchanging walls 211.

Conveniently, the base wall 1011 of the housing 1010 is made of a thermally conductive material (e.g. an Al alloy) whereas the outer case 1012 may be made of a plastic or metallic material.

The power electronic components 200 of the electronic module 101 are arranged in such a way to be in physical contact with the base wall 1011 and consequently in thermal contact with the first heat exchanging walls 211.

To this aim, they may be conveniently mounted a dedicated board 1013 (according to known circuit arrangement techniques) fixed to the base wall 1011.

Conveniently, the dedicated board 1013 is spaced from the base wall 1011 to form a channel extending along a longitudinal direction parallel to the main longitudinal axis 20, between the ends 2E, 2F of the heat exchanger structure, to allow the passage of a cooling fluid (e.g. ventilation air).

Possible additional electronic components 400 of the electronic module 101 may be mounted on the same dedicated board 1013 or on a further dedicated board 1014 (according to known circuit arrangement techniques) fixed to the base wall 1011.

Also the further dedicated board 1014 is conveniently spaced from the dedicated board 1013 to form a further longitudinal to allow the passage of a cooling fluid (e.g. ventilation air).

The power electromagnetic components 300 of the rack module 110 are accommodated within the recess 23 formed by the second portion 22 of the heat exchanger structure 1.

In this way, they are conveniently arranged outside the electronic module 101 and are segregated from the internal components of this latter.

Conveniently, the base wall 1011 of the electronic module 101 covers at least partially the recess 23, thereby forming, in cooperation with this latter, a further channel for the passage of a cooling fluid (e.g. ventilated air), which extends in direction parallel to the main longitudinal axis 20 between the ends 2E, 2F of the heat exchanger structure.

Conveniently, the base wall 1011 of the electronic module 101 may include suitable windows (not shown) to allow cabling of the power electromagnetic components 300 accommodated within the recess 23 of the heat exchanger structure.

Figure 7:
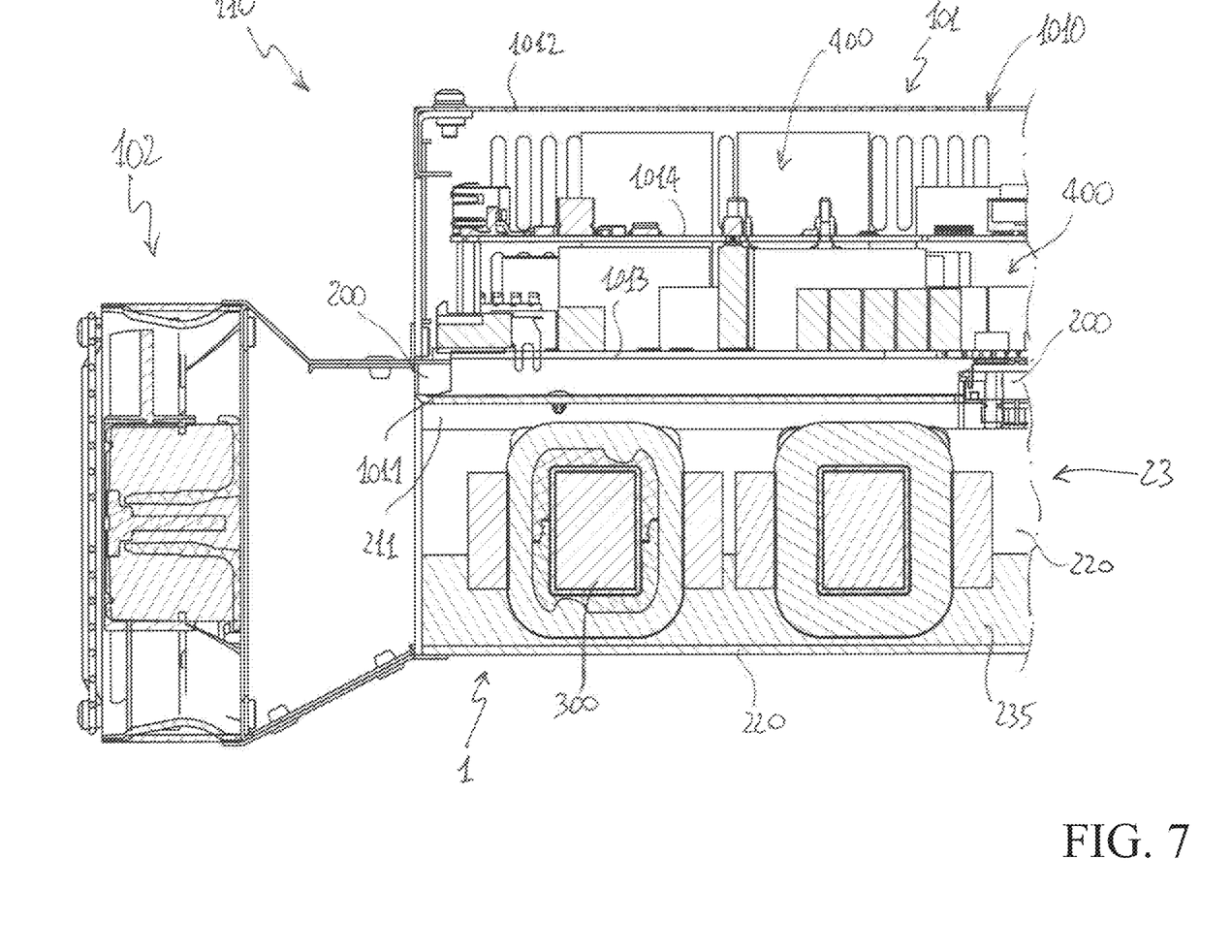

As shown in FIGS. 6-7, for the installation in a rack assembly 100, the rack module 110 may be operatively associated with suitable ventilation means 102 (which may be of known type) at one end 2E of the respective heat exchanger structure.

In this way, a suitable flux of cooling fluid (e.g. air) may be forced to pass along the longitudinal recess 23 (at least along the resin-free portion of this latter and, possibly, the channels 236 formed in the resin), along the longitudinal channels formed by the fins 213 of the heat exchanger structure 1 and along the longitudinal channels within the electronic module 101.

Figure 8:
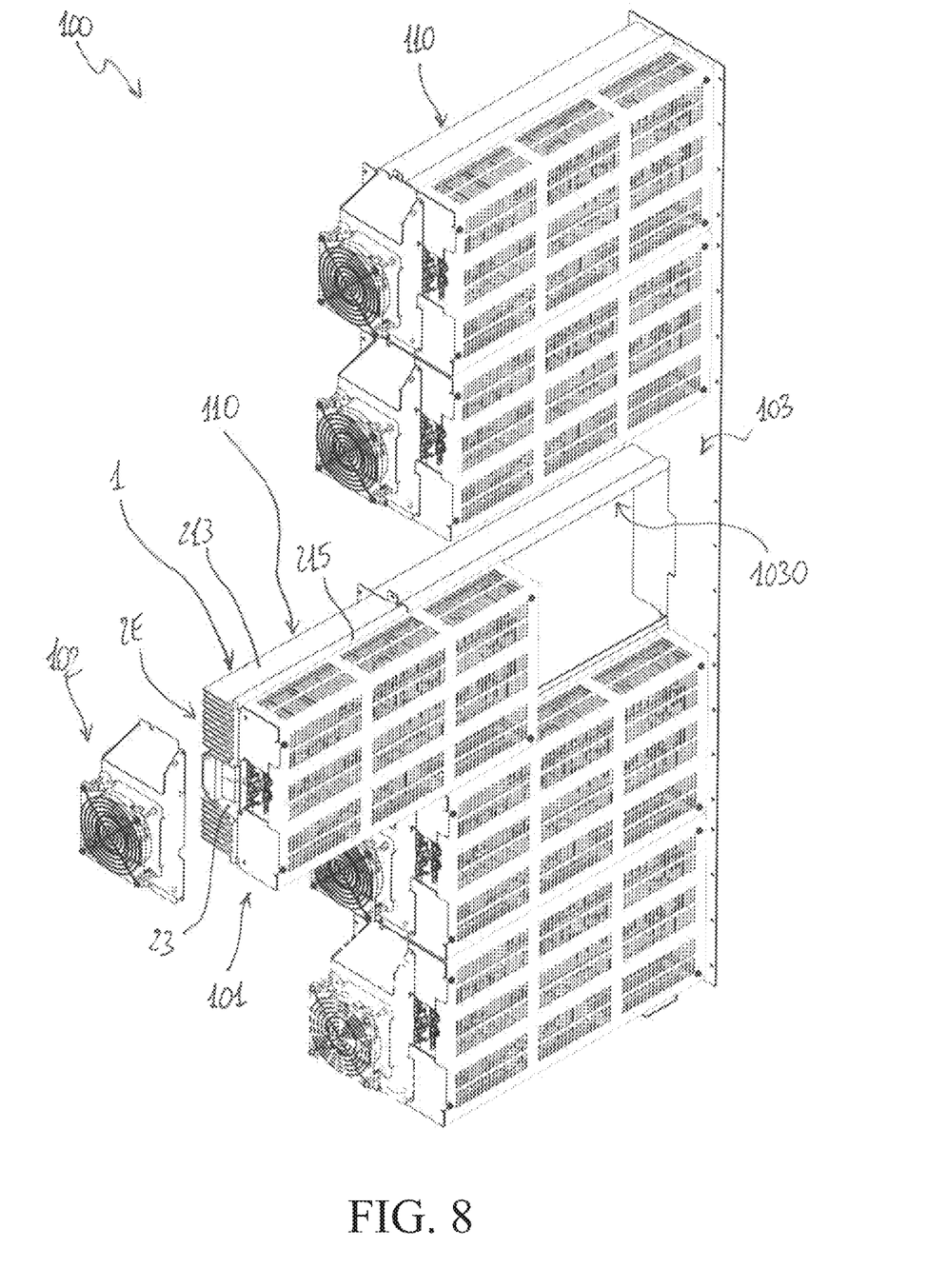
FIG. 8 schematically illustrates a rack module installed in a rack assembly.

An example of rack assembly 100, particularly suitable for a battery charger installation, is schematically shown in FIG. 8.

As it is possible to notice, the rack assembly 100 comprises a plurality of stacked rack modules 110 operatively coupled to a supporting frame 103.

Each rack module 110 comprises a heat exchanger structure 1 and may be conveniently arranged as shown in FIGS. 3-5.

As the heat exchanger structure 1 provides heat absorption and dissipation for both the power electronic components 200 and the power electromagnetic components 300, high power density levels can be achieved in arranging each rack module 110 while ensuring a proper thermal management of the components.

The rack assembly 100 preferably comprise one or more ventilation groups 102 (which may be of known type).

Each rack module 110 may be operatively associated with a suitable ventilation group 102 (at one end 2E of the respective heat exchanger structure) to improve cooling of its internal components.

Thanks to the heat exchanger structure 1, which provides mechanical support both the power electronic components 200 and the power electromagnetic components 300, each rack module 110 can be arranged with a compact structure that can be easily installed on a rack assembly 100. To this aim, the coupling portions 215 of a heat exchanger structure 1 may be slidingly coupled with suitable coupling tracks 1030 of the supporting frame 103 of the rack assembly 100 and suitable fixing means of known type (e.g. screws) may be used to firmly fix the rack module 110 to the supporting frame 103.

The heat exchanger structure 1, according to the invention, allows achieving the intended aims and objects.

The heat exchanger structure 1 provides efficient a suitable mechanical support and an efficient heat absorption and dissipation for both power electronic components and power electromagnetic components operatively associated therewith.

This allows simplifying the overall thermal management of the rack assembly while simplifying the installation of electronic and electromagnetic components in the rack assembly with an easy achievement of high density power levels.

The heat exchanger structure 1 provides (and/or allows the formation of) suitable channels to allow a cooling fluid to come in contact with the surfaces absorbing heat from both power electronic components and power electromagnetic components operatively associated to the heat exchanger structure. This allows simplifying the implementation of efficient ventilation arrangements in the rack assembly.

The heat exchanger structure 1 is of easy installation in a rack assembly and, at the same time and can be easily and cheaply manufactured at industrial level by means of relatively simple metallurgical processes of known type, e.g. extrusion.

The invention claimed is:

1. A heat exchanger structure for a rack assembly formed by a shaped body of thermally conductive material and comprising a first heat exchanging portion adapted to provide a mechanical support for one or more power electronic components of said rack assembly and adapted to absorb and dissipate heat generated by said power electronic components wherein it comprises a second heat exchanging portion adapted to provide a mechanical support for one or more power electromagnetic components of said rack assembly and adapted to absorb and dissipate heat generated by said power electromagnetic components, said second heat exchanging portion forming a recess for accommodating said power electromagnetic components and further comprising a base wall attached to said first heat exchanging portion at least partially covering said recess and at least partially segregating said power electromagnetic components with respect to said power electronic components and the surrounding environment.

2. The heat exchanger structure, according to claim 1, wherein it is formed by a single piece of thermally conductive material.

3. The heat exchanger structure, according to claim 1, wherein said first heat exchanging portion comprises at least a first heat exchanging wall having opposite first and second surfaces at opposite first and second main sides of said shaped body, said first heat exchanging wall being adapted to provide a mechanical support for said power electronic components and to be in thermal contact with said power electronic components to absorb heat generated by said power electronic components at said first surface, said first heat exchanging wall comprising fins protruding from said second surface, and said base wall is attached to said first surface and forms, in cooperation with said recess, a channel for passage of a cooling fluid between opposite open ends of said heat exchanger structure.

4. The heat exchanger structure, according to claim 3, wherein said fins have one or more corrugated surfaces.

5. The heat exchanger structure, according to claim 3, wherein said first heat exchanging portion comprises a pair of first heat exchanging walls extending along directions parallel to a main longitudinal axis and are mutually spaced and coplanar.

6. The heat exchanger structure, according to claim 1, wherein said second heat exchanging portion comprises at least a second heat exchanging wall defining said recess, said recess having a blind bottom and being open towards a first main side of said shaped body.

7. The heat exchanger structure, according to claim 6, wherein said second heat exchanging wall has one or more corrugated surfaces.

8. The heat exchanger structure, according to claim 1, wherein said recess is at least partially filled with a thermal resin, in which said power electromagnetic components are at least partially buried.

9. The heat exchanger structure, according to claim 8, wherein at least an air channel is formed in said thermal resin.

10. The heat exchanger structure, according to claim 6, wherein said second heat exchanging portion comprise one or more second heat exchanging walls forming said recess, said recess extending along a longitudinal direction parallel to a main longitudinal axis.

11. The heat exchanger structure, according to claim 5, wherein said recess is positioned between said pair of first heat exchanging walls.

12. An apparatus comprising: a rack module for low or medium voltage applications that includes a heat exchanging structure formed by a shaped body of thermally conductive material and comprising a first heat exchanging portion adapted to provide a mechanical support for one or more power electronic components and adapted to absorb and dissipate heat generated by said power electronic components wherein it comprises a second heat exchanging portion adapted to provide a mechanical support for one or more power electromagnetic components and adapted to absorb and dissipate heat generated by said power electromagnetic components, said second heat exchanging portion forming a recess for accommodating said power electromagnetic components and further comprising a base wall attached to said first heat exchanging portion at least partially covering said recess and at least partially segregating said power electromagnetic components with respect to said power electronic components and the surrounding environment.

13. An apparatus comprising: a rack assembly for low or medium voltage applications that includes one or more heat exchanging structures formed by a shaped body of thermally conductive material and comprising a first heat exchanging portion adapted to provide a mechanical support for one or more power electronic components of said rack assembly and adapted to absorb and dissipate heat generated by said power electronic components wherein it comprises a second heat exchanging portion adapted to provide a mechanical support for one or more power electromagnetic components of said rack assembly and adapted to absorb and dissipate heat generated by said power electromagnetic components, said second heat exchanging portion forming a recess for accommodating said power electromagnetic components and further comprising a base wall attached to said first heat exchanging portion at least partially covering said recess and at least partially segregating said power electromagnetic components with respect to said power electronic components and the surrounding environment.

14. An apparatus comprising: a battery charger installation that includes a rack assembly for low or medium voltage applications that includes one or more heat exchanging structures-formed by a shaped body of thermally conductive material and comprising a first heat exchanging portion adapted to provide a mechanical support for one or more power electronic components of said rack assembly and adapted to absorb and dissipate heat generated by said power electronic components wherein it comprises a second heat exchanging portion adapted to provide a mechanical support for one or more power electromagnetic components of said rack assembly and adapted to absorb and dissipate heat generated by said power electromagnetic components, said second heat exchanging portion forming a recess for accommodating said power electromagnetic components and further comprising a base wall attached to said first heat exchanging portion at least partially covering said recess and at least partially segregating said power electromagnetic components with respect to said power electronic components and the surrounding environment.

15. The heat exchanger structure, according to claim 2, wherein said first heat exchanging portion comprises at least a first heat exchanging wall having opposite first and second surfaces at opposite first and second main sides of said shaped body, said first heat exchanging wall being adapted to provide a mechanical support for said power electronic components and to be in thermal contact with said power electronic components to absorb heat generated by said power electronic components at said first surface, said first heat exchanging wall comprising fins protruding from said second surface, and said base wall is attached to said first surface and forms, in cooperation with said recess, a channel for passage of a cooling fluid between opposite open ends of said heat exchanger structure.

16. The heat exchanger structure, according to claim 4, wherein said first heat exchanging portion comprises a pair of first heat exchanging walls extending along directions parallel to a main longitudinal axis and are mutually spaced and coplanar.

17. The heat exchanger structure, according to claim 2, wherein said second heat exchanging portion comprises at least a second heat exchanging wall defining said recess, said recess having a blind bottom and being open towards a first main side of said shaped body.

18. The heat exchanger structure, according to claim 2, wherein said recess is at least partially filled with a thermal resin, in which said power electromagnetic components are at least partially buried.

19. The heat exchanger structure, according to claim 9, wherein said second heat exchanging portion comprise one or more second heat exchanging walls forming said recess, said recess extending along a longitudinal direction parallel to a main longitudinal axis.

20. The heat exchanger structure, according to claim 10, wherein said recess is positioned between a pair of said first heat exchanging walls.

* * * * *